(12) United States Patent
Pekonen et al.

(10) Patent No.: US 6,985,032 B2
(45) Date of Patent: Jan. 10, 2006

(54) AMPLIFIER LINEARISATION

(75) Inventors: Elias Pekonen, Oulu (FI); Andrzej Haczewski, Oulu (FI); Jaspal Bharj, Eastcote (GB)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/416,010

(22) PCT Filed: Oct. 25, 2001

(86) PCT No.: PCT/EP01/12429

§ 371 (c)(1),
(2), (4) Date: Dec. 10, 2003

(87) PCT Pub. No.: WO02/37669

PCT Pub. Date: May 10, 2002

(65) Prior Publication Data

US 2004/0070449 A1    Apr. 15, 2004

(51) Int. Cl.
*H03F 1/26* (2006.01)

(52) U.S. Cl. ........................ 330/149; 330/133
(58) Field of Classification Search ........... 330/129, 330/133, 149, 284, 285
See application file for complete search history.

(56) References Cited

U.S. PATENT DOCUMENTS

| | | | |
|---|---|---|---|
| 4,943,785 A | 7/1990 | Benz et al. | 330/277 |
| 5,093,667 A | 3/1992 | Andricos | 342/372 |
| 5,101,172 A | 3/1992 | Ikeda et al. | 330/136 |
| 5,420,536 A | 5/1995 | Faulkner et al. | 330/149 |
| 5,675,288 A | 10/1997 | Peyrotte et al. | 330/149 |
| 6,255,908 B1 * | 7/2001 | Ghannouchi et al. | 330/149 |

FOREIGN PATENT DOCUMENTS

| | | |
|---|---|---|
| EP | 0 687 062 A1 | 12/1995 |
| EP | 0 982 851 A1 | 3/2000 |
| GB | 2 282 291 A | 3/1995 |

OTHER PUBLICATIONS

Siliconix, "FETs as Voltage-Controlled Resistors", AN105, Mar. 10, 1997, pp. 1-6.*

* cited by examiner

Primary Examiner—Steven J. Mottola
(74) Attorney, Agent, or Firm—Squire, Sanders & Dempsey L.L.P.

(57) ABSTRACT

The present invention relates to a lineariser for use with an amplifier and to a method of linearising an amplifier. The lineariser comprises an input to receive an input signal and an output for outputting an adjusted signal. A gain variations adjustment means are provided for adjusting amplitude dependent gain variations of the signal. A phase variations adjustment means are provided for adjusting amplitude dependent phase variations of the signal. Said gain and phase variations adjustment means are adapted to be individually adjustable elements on the signal path between said input and output. A variable gain amplifier is provided on the signal path between the gain variations adjustment means and phase variations adjustment means. The adjusted signal is then input to said amplifier.

36 Claims, 5 Drawing Sheets

Shifting of AM-AM and AM-PM curves

AMPLIFIER LINEARISATION

FIELD OF THE INVENTION

The present invention relates to linerisation of an amplifier, and in particular, but not exclusively, to a lineariser for use with a power amplifier for amplifying radio frequency (RF) signals. A lineariser implemented in accordance with the invention may be used in elements of a communication system.

BACKGROUND OF THE INVENTION

A communication system comprises signalling points or nodes, such as user terminals, different exchanges, routers, switches, links, stations and so on. The communication also comprises appropriate communication media between the signalling points. Different signalling points may be situated within an element of the communication system, wherein the communication may occur with the element. The communication media may comprise, for example, a wired interface, a radio frequency interface or an optical interface. The communication may be carried by analogue or digital signals or a combination of these, such as digitally-modulated analogue signals.

Signal amplification is required in various communication applications. For example radio frequency signals transmitted between signalling points in a communication system employing radio transmission may need to be amplified during some stage of the transmission and/or reception. The signalling points may be, for example, a transmitting station and a receiving station or an intermediate node of the communication system. The amplification of the signals is required for example since the amplitude of a signal tends to be attenuated during transmission between signalling points, thereby decreasing the quality of the transmission. Also, noise becomes typically added to the signal from other sources as well as from the transmitting and receiving and the possible intermediate apparatus itself. A communication system is thus typically provided with amplifying means to compensate for the attenuation. Amplification of the signal may also be used for increasing the signal-to-noise ratio of the signal.

An input signal may be amplified by means of a power amplifier. The power amplifier may have at its input a modulated radio signal. The input radio signal may be a modulated digital signal. The power amplifier, when operated in a non-linear region, typically close to saturation produces intermodulation distortion products at its output as well as the desired carrier signals. The intermodulation distortion products are typically produced on either side of the desired carrier signals. Intermodulation distortion products are typically caused by the power amplifier not acting as a linear amplifier, which occurs when the power amplifier is operating close to saturation. The intermodulation distortion produces frequencies at multiples of the carrier frequency of the desired signals. These frequencies tend to be lower in signal strength than the desired carriers. These intermodulation distortion products increase the spectral space occupied by the signal and are therefore undesirable. One way to reduce the intermodulation distortion products is to operate the power amplifiers as linear amplifiers. The power amplifiers would be operated so that there is a substantially linear relationship between the input signal power and the output signal power.

Amplifiers that are intended to cover a range of frequencies should provide as linear performance as possible across the designated frequency band. However, an amplifier may introduce distortions. The distortion may be linear or non-linear. The linear distortions relate to bandwidth limitations. The non-linear distortions have two components called AM-AM (amplitude modulation-amplitude modulation) or AM-PM (amplitude modulation-phase modulation) distortion. In the non-linear case amplitude variations in the input signal may cause undesirable amplitude and/or phase variations in the output signal. In addition, the distortions may cause mixing between the different frequency components present in the signal. The term 'AM-AM' refers to amplitude dependent amplitude (gain) variations and the term 'AM-PM' refers to amplitude dependent phase variations.

A prior art solution for the linearity problem exploits the fact that the non-linearity increases with the output power level of the amplifier. Thus, if the input level is reduced, i.e. "backed-off", the amplifier is arranged to operate only within its more linear region. However, this approach may not be desirable in all applications as it fails to utilise the full range of available output voltage-swing. The backing-off may have an disadvantageous effect on power efficiency of the amplifier.

The linearity of the amplifying function can also be improved by provision of a linearisation function designed to reduce the distortion. Linearisers have been developed which enable operation of an amplifier with reduced intermodulation distortion at a point on the gain/input power or phase/input power curves after which the amplifier does not act as a linear amplifier. Such a lineariser is placed in the signal path before the power amplifier and may therefore precondition the input signal before passing it to the power amplifier. In other words the gain of the lineariser increases as the power of the input signal increases and increases in such a way as to substantially oppose the typical power amplifier power characteristics. This is called gain expansion. In addition, the linearizer may change the phase of the input signal as the power of the input signal increases. The change in the phase may be such that it opposes the typical power amplifier phase characteristics. This is called phase expansion.

A lineariser should be capable of producing enough of gain and/or phase expansions to mitigate the non linear amplitude and phase problems associated with power amplifiers in a region that is close to saturation. The effect of the lineariser is to increase the effective range over which the power amplifier is linear but allows the power amplifier to operate in its more efficient non-linear range. However, the inventor has found that the prior art linearisers may not be capable of providing an optimised independent amplitude and phase tuning for linearity and efficiency of the prior art lineariser arrangements. In addition, the prior art linearisers are of substantially big size, thereby making the integration thereof with the amplifier difficult in applications requiring substantially small sized components, such as mobile phones.

SUMMARY OF THE INVENTION

Embodiments of the present invention aim to address one or several of the above problems.

According to one aspect of the present invention, there is provided a lineariser for use with an amplifier comprising: an input to receive an input signal; an output for outputting adjusted signal to said amplifier; a signal path between the input and the output; a gain variations adjustment means on the signal path for adjusting amplitude dependent gain variations of the signal; a phase variations adjustment means on the signal path for adjusting amplitude dependent phase variations of the signal, said gain and phase variations adjustment means being individually adjustable elements; and a variable gain amplifier located on the signal path between the gain variations adjustment means and phase variations adjustment means.

The arrangement is preferably such that the adjustment of the amplitude dependent gain variations does not produce any substantial amplitude dependent phase variations in the signal and/or vice versa.

The variable gain amplifier may be arranged for shifting amplitude dependent phase and gain variation curves relative to each other, and more particularly, the variable gain amplifier may be provided for shifting the transfer characteristic curves of the amplitude dependent phase and gain variations relative to each other.

A second variable gain amplifier may be provided for adjusting the power level of the signal to be input in said amplifier. A third variable gain amplifier may be provided for adjusting the power level of the input signal.

The gain variations adjustment means may comprise a field effect transistor (FET). The phase variations adjustment means may be provided with a non-linear resistor element.

The lineariser may be implemented as a microwave monolithic integrated circuit.

The signal may be a radio frequency signal transmitted between a base station and a mobile station of a cellular telecommunication system.

According to another aspect of the present invention there is provided a method of linearising an amplifier, comprising: inputting a signal in a lineariser; adjusting amplitude dependent gain variations of the signal independently from amplitude dependent phase variations of the signal; adjusting amplitude dependent phase variations of the signal independently from the adjustment of the amplitude dependent gain variations of the signal, the amplitude dependent gain variations and the amplitude dependent phase variations being adjusted by separate adjustment means; adjusting the power level of the signal by a variable gain amplifier located on the signal path between the gain variations adjustment means and phase variations adjustment means; and outputting the signal from the lineariser to be input in said amplifier.

The embodiments of the invention may improve the linearity of a radio frequency amplifier. The embodiments may also enable efficient use of the amplifying range of an amplifier. In addition, the embodiments may enable an improved adjustment for the linearisation. The embodiments may also improve the possibilities to integrate a lineariser with an amplifier in applications requiring substantially small and/or integrated components.

BRIEF DESCRIPTION OF DRAWINGS

For better understanding of the present invention, reference will now be made by way of example to the accompanying drawings in which.

DESCRIPTION OF PREFERRED
EMBODIMENTS OF THE INVENTION

Figure 1:
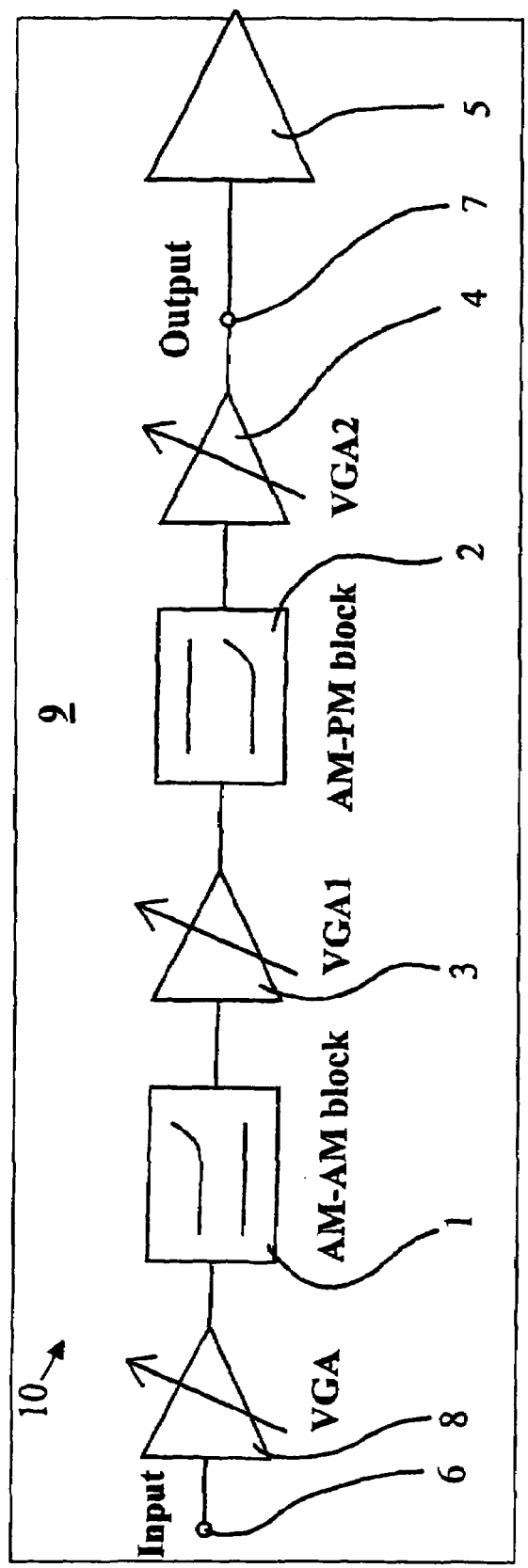
FIG. 1 shows one embodiment of the present invention.

Reference is made to FIG. 1 which shows a block diagram of a lineariser i.e. predistorter 10 that has been implemented in accordance with an embodiment of the present invention. More particularly, FIG. 1 shows an analogue predistorter configuration that is suitable for integration with an amplifier 5 so that they form a module. The predistorter is placed before the amplifier on the signal path, i.e. such that the signal output from the distorter element 10 is input to the amplifier 5.

The predistorter 10 is provided with two separate adjustment blocks 1 and 2. By means of this the analogue predistorter 10 is adapted to enable independent or orthogonal adjustment of the AM-AM and AM-PM transfer characteristics of the lineariser. By means of tuning the AM-AM and AM-PM characteristics of the lineariser it is possible to make the cascade of the lineariser and amplifier combination to behave in a more linear manner.

More particularly, the predistorter 10 provides a possibility to tune the AM-AM and AM-PM transfer characteristics independently relative to each other. The independent adjustment can be accomplished such that the power level point (so called knee point) where the AM-AM correction starts and the power level point where the AM-PM correction starts can be shifted relative to each other. This relative shifting is illustrated in more detail by the diagrams of FIGS. 4 to 6.

Figure 2:
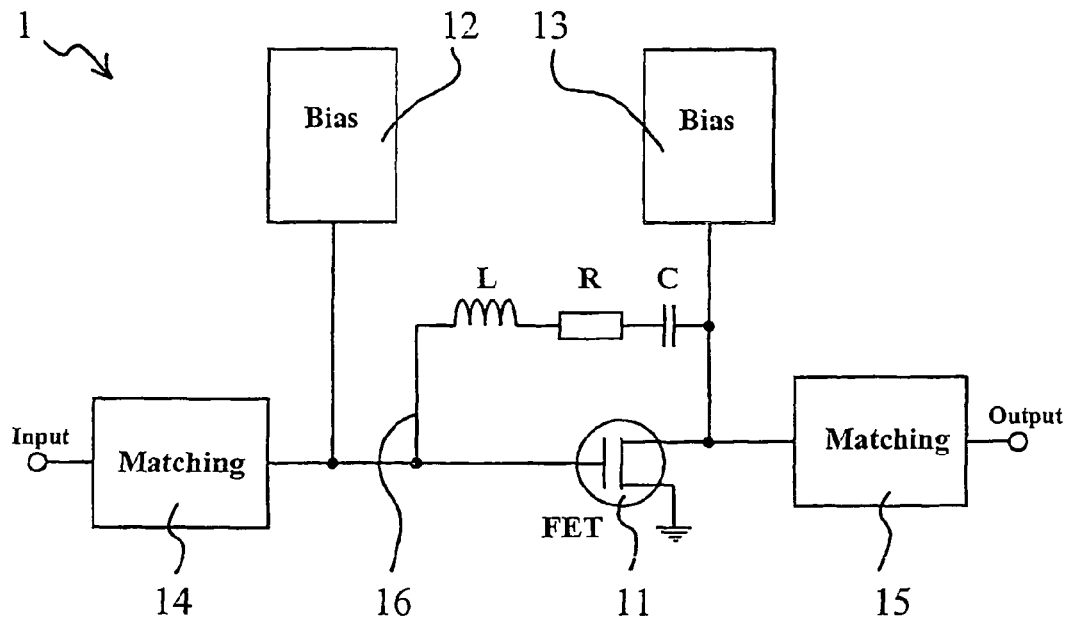
FIG. 2 shows an amplitude dependent gain variations block for use in the embodiments of the invention.

As shown in more detail by FIG. 2, the AM-AM adjustment block 1 comprises of a FET 11 (Field Effect Transistor). The arrangement is such that the AM-AM block 1 is adapted to produce only AM-AM gain expansion while the AM-PM transfer characteristics of the lineariser are kept constant. This is illustrated by the two diagrams of FIG. 4.

The FET 11 is preferably biased in a pinch-off region. In other words, the FET 11 is preferably operated close to i.e. in the vicinity of the pinch-off region so that the gain expansion characteristics of the FET 11 in this region can be utilised. The pinch-off region of the FET 11 is the region where the FET 11 is just switched on. The pinch-off region is typically controlled by gate voltage.

Figure 4:
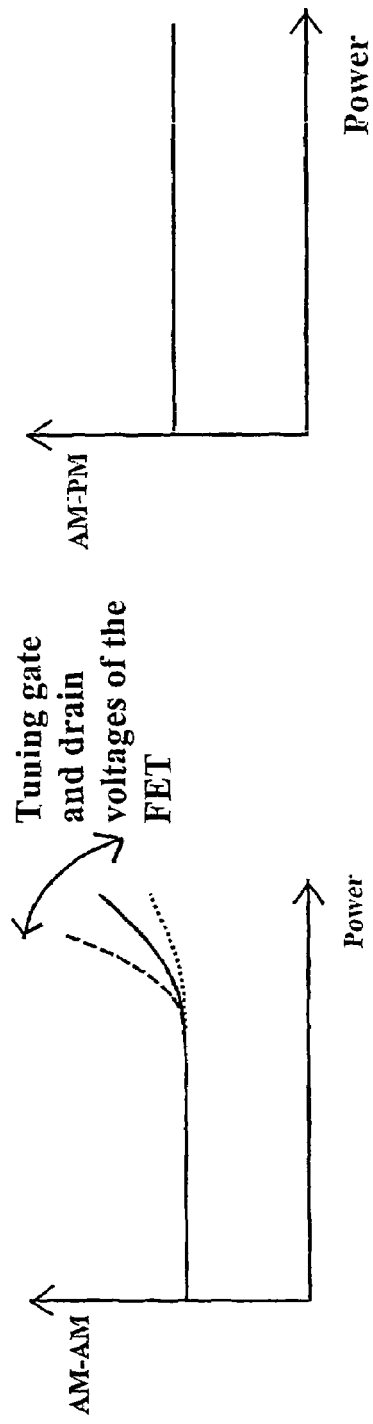
FIG. 4 illustrates gain and phase responses for the block shown in FIG. 2.
Figure 5:
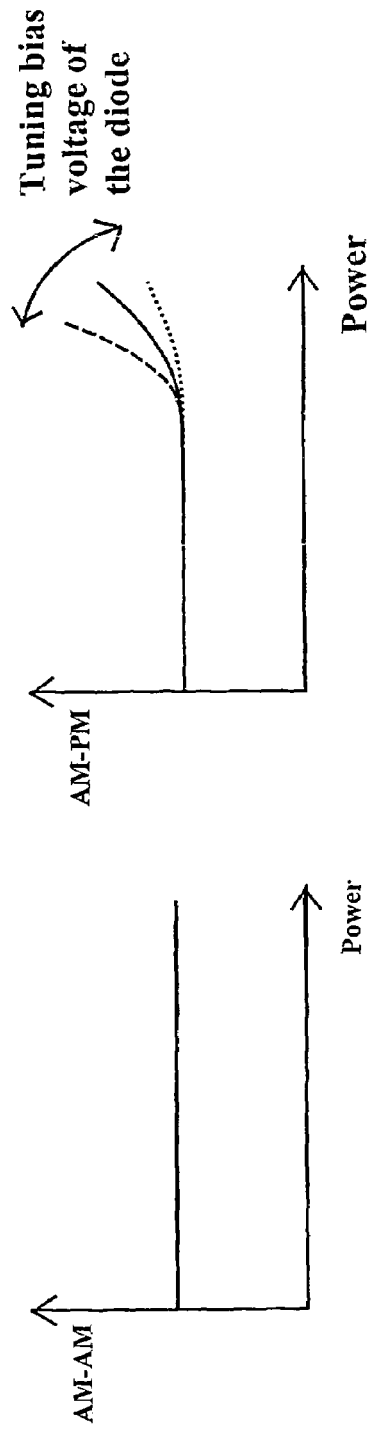
FIG. 5 illustrates gain and phase responses for the block shown in FIG. 3.

The adjustment can be enabled by making it possible to tune the gate and drain bias voltages 12, 13 of the FET 11. This does not influence the AM-PM characteristics of the block 1 and these remain substantially flat (see AM-PM/Power curve of FIG. 4). The tuning is accomplished such that an AM-AM/Power curve as illustrated by FIG. 4 can be obtained. That is, the AM-AM block is tuned such that the AM-AM response of the cascaded lineariser and amplifier is made as flat as possible. In the usable tuning range of the gate and drain voltages the change of the shape of the AM-PM curve is negligible. The tuning range of the voltages is preferably wide enough so that an improvement in the linearity can be obtained.

In the preferred embodiment the gate voltage is the main tuning voltage. The drain voltage may then be used for fine tuning. However, it shall be appreciated that the tuning is not restricted to use of only one voltage but both of the drain and gate voltages can be used if this is deemed necessary.

The matching blocks 14, 15 are for matching the impedances of the FET 11 to the impedances of other blocks connected to the AM-AM block 1. Inductor L, resistor R and capacitor C of FIG. 2 form a feedback network 16 for the FET 11. The values of the components L, R and C are preferably chosen such that a correct shape of the AM-AM can be obtained so that the FET 11 can be tuned with the voltages, that as flat AM-PM as possible is obtained, and that the matching of the FET 11 can be made easier.

The AM-PM adjustment block 2 is adapted to provide only AM-PM characteristics correction, that is a correction of the amplitude dependent phase variation. The correction is provided without affecting the amplitude dependent gain i.e. the AM-AM transfer characteristics of the lineariser (see FIG. 5).

Figure 3:
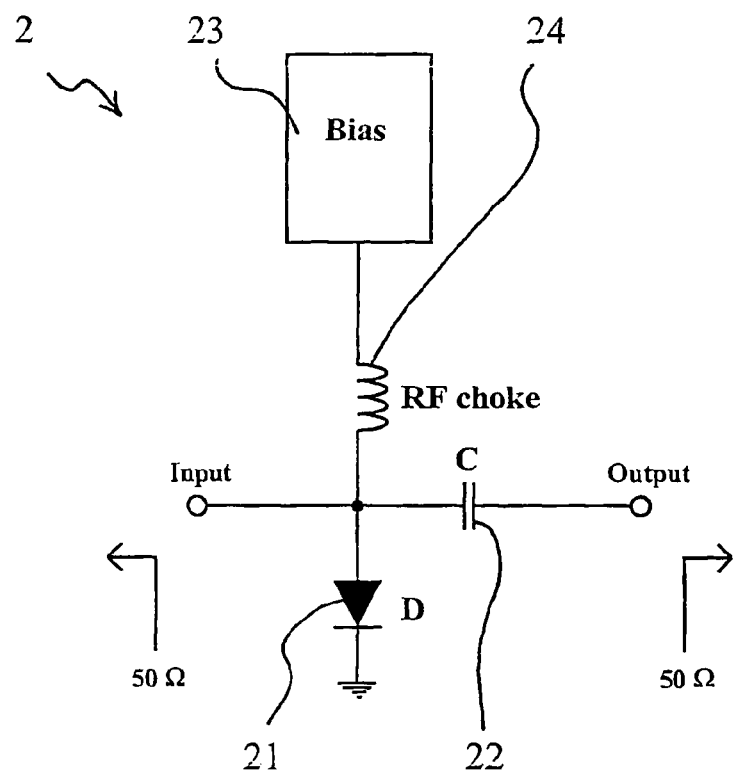
FIG. 3 shows an amplitude dependent phase variations block for use in the embodiments of the invention.

As shown in more detail by FIG. 3, the AM-PM block 2 consists of a forward biased diode 21 and a capacitor 22. Use of a non-linear resistor element (represented by the diode 21) with capacitors enables provision of an adjustment block that produces a substantially flat AM-AM response. The adjustment is adapted to be accomplished by tuning the bias voltage of the diode 21. More particularly, the diode 21 is shown to be supplied with bias voltage from a bias voltage source 23. The adjustment is done by varying the bias voltage supplied by the source 23. The bias voltage is used to tune the slope of the AM-PM transfer characteristics of the block 2. This tuning is illustrated by the right hand side diagram of FIG. 5. A choke 24 may be provided for preventing the RF signal from entering the bias network 23.

Figure 6:
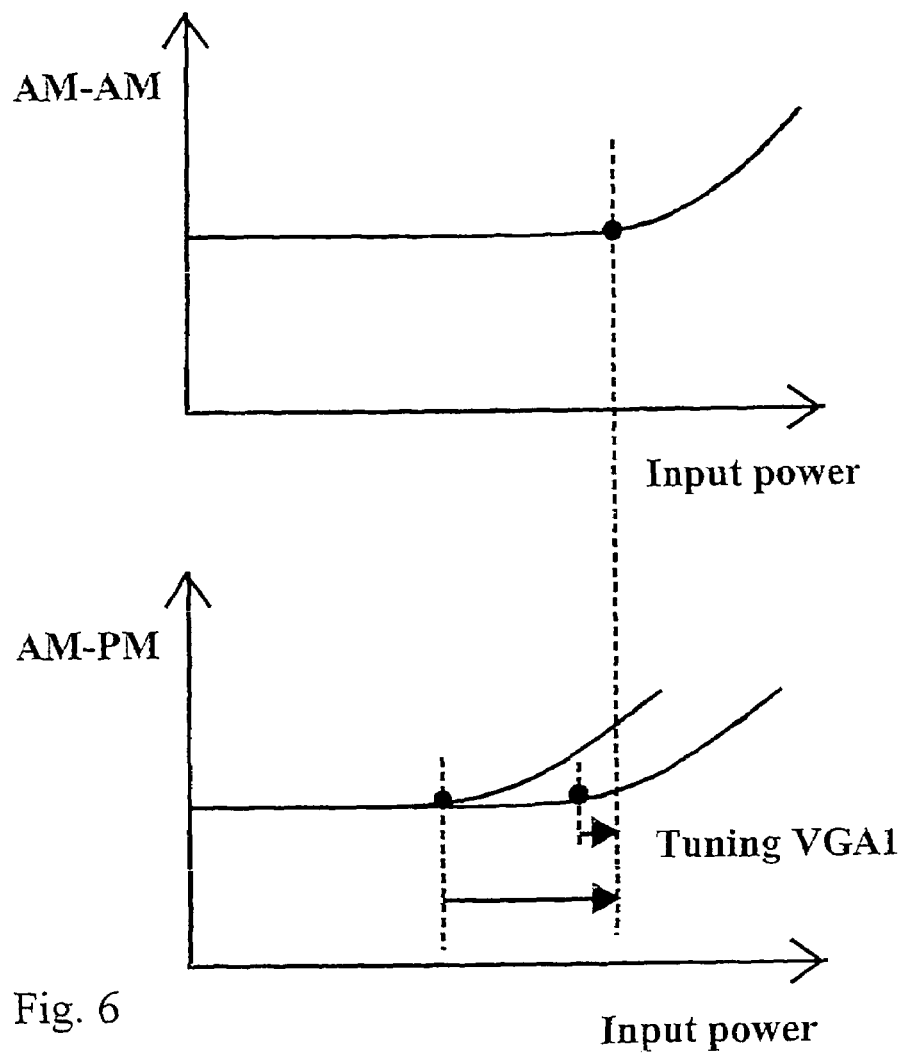
FIG. 6 illustrates the shifting between amplitude dependent gain variations and amplitude dependent phase variations curves.

The predistorter 10 may also be provided with a first variable gain amplifier (VGA1) 3. The VGA1 can be used for setting the input power level for the AM-PM block 2. The variable gain amplifier 3 may be provided for shifting the AM-AM and AM-PM curves within the predistorter 10 relative to each other. The diagram of FIG. 6 illustrates an example of the shifting of the AM-AM and AM-PM transfer characteristics relative to each others by changing the gain of the first variable gain amplifier 3.

The predistorter 10 may also be provided with a second variable gain amplifier (VGA2) 4. The second variable gain amplifier 4 can be used to set the power level of the input signal for the RF amplifier. The variable gain amplifier 4 may be provided for shifting the AM-AM and AM-PM curves of the predistorter 10 relative to the AM-AM and AM-PM curves of the amplifier 5 so that an improved linearisation of the amplifier can be achieved. The variable gain amplifier 4 may enable a more optimal linearity improvement.

It shall be appreciated that the function of the variable gain amplifiers of FIG. 1 is not limited to amplification of signals. In some embodiment the VGAs may also be used for attenuation of the signals.

Figure 7:
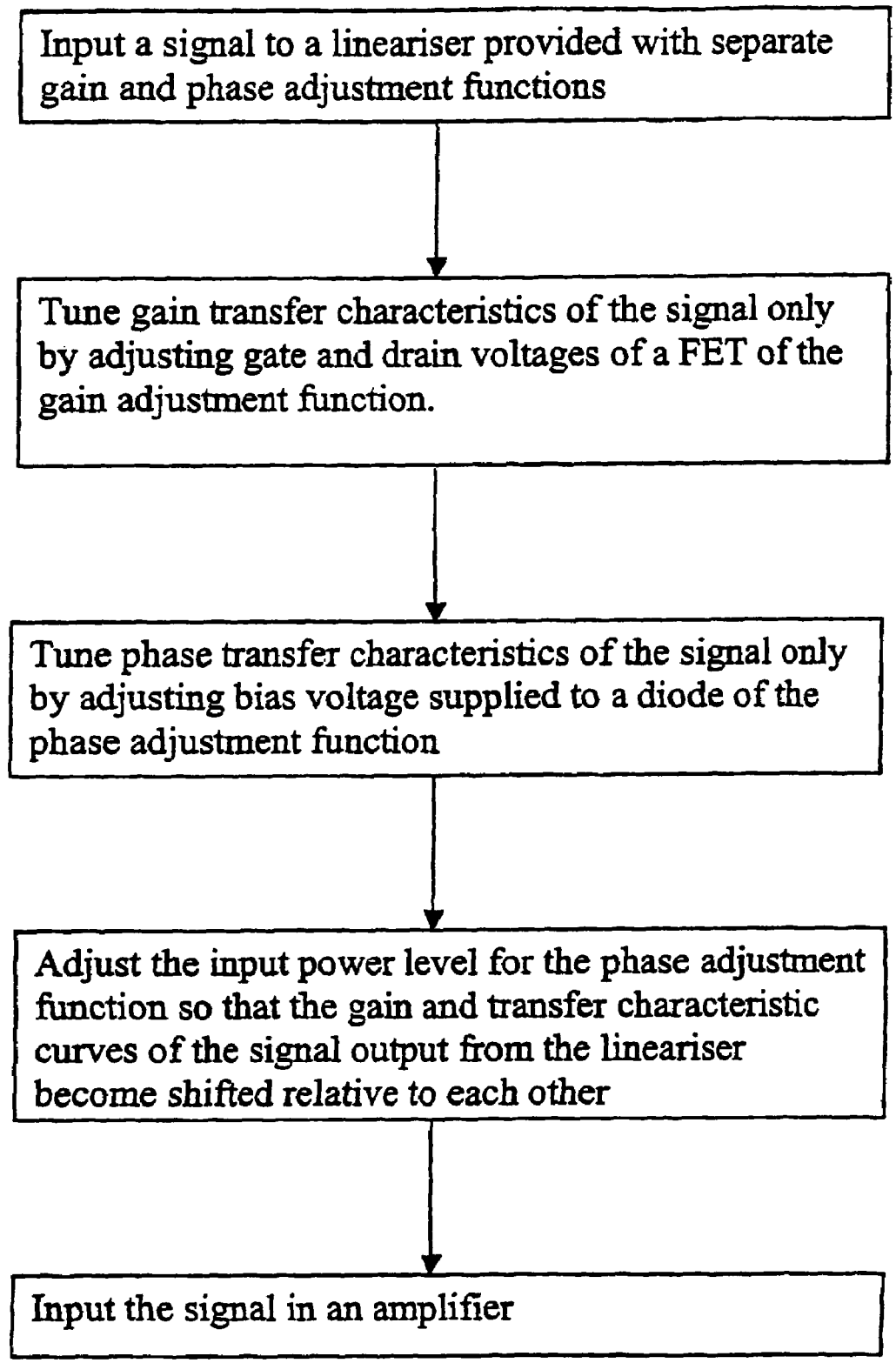
FIG. 7 is a flowchart illustrating the operation of one embodiment of the present invention.

As shown by FIG. 7, in operation the tuning of the AM-AM transfer characteristic may be accomplished by adjusting the gate and drain voltages of the FET 11. The tuning the AM-PM transfer characteristic is preferably accomplished first by adjusting the bias voltage supplied to the diode 21. The input power level for the AM-PM block 2 may then be adjusted by changing the gain of a variable gain amplifier 3 in order to shift the AM-AM and AM-PM transfer characteristic curves and thus the power points thereof relative to each others.

FIG. 1 shows also a third variable gain amplifier 8 (VGA3). This variable gain amplifier may be used to adjust the power level of the input signals. By the provision of the VGA3 it is possible to widen the operational range of the lineariser 10, thereby enabling use thereof in a wide range of different applications. In other words, the variable gain amplifier 8 at the input of the lineariser 10 functions to set an appropriate correct input power level for the lineariser or predistorter. By means of this the lineariser 10 can be fitted to a variety of systems which have different power levels.

The predistorter or lineariser 10 is believed to provide a compact, substantially cheap and easily adjustable lineariser for an RF amplifier. It is possible to avoid the shortcoming of the prior art lineariser in that the adjustments of the gain characteristics influenced the phase characteristics and vice versa. The circuitry enables shifting of the AM-AM and AM-PM responses relative to each other.

It shall be appreciated that the placing of the AM-AM adjustment block 1 and the AM-PM adjustment block 2 is interchangeable, and should not have any effect to the operation of the predistorter 10.

The predistorter may also be implemented as a Microwave Monolithic Integrated circuit 9 (MMIC), as indicted in FIG. 1. This type of implementation may ease the integration of the predistorter into a Power Amplifier (PA). MMICs as such are known and are used within many modern circuits, for example in satellite and mobile telephony technologies.

Figure 8:
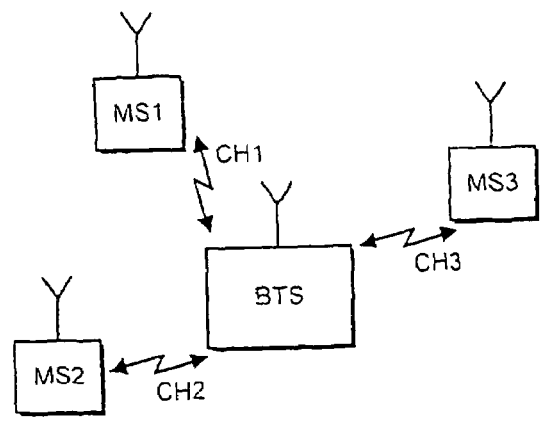
FIG. 8 shows a system wherein a lineariser in accordance with the invention may be employed.

Reference is now made to FIG. 8 illustrating a system in which linearisers in accordance with the invention may be employed. The exemplifying system is a cellular mobile radio communication system allowing a plurality of mobile stations MS1, MS2, MS3 to communicate with a base (transceiver) station BTS in a common cell via respective channels CH1, CH2, CH3. The radio communication between a transmitting station and a receiving station may be implemented in any appropriate manner and may be based on any communication standard. Therefore the radio link as such will not be described in more detail herein. Examples of cellular communication systems include, without being limited to these, standards such as AMPS (American Mobile Phone System), DAMPS (Digital AMPS), GSM (Global System for Mobile communications), EDGE (enhanced data rate for GSM evolution), GPRS (General Packet Radio Service), CDMA (Code Division Multiple Access), IS-95 or any of the $3^{rd}$ generation (3G) communication systems, such as WCDMA (Wideband CDMA), UMTS (Universal Mobile Telecommunications System), or IMT-2000 (International Mobile Telecommunications System 2000) and so on.

The mobile stations as well as the base station are provided with necessary transceiver components (not shown in FIG. 8) so as to be able to handle signals to be transmitted and received by respective antennae. These components are known to a skilled person and do not as such form a part of the invention, and are thus not described in more detail. It is sufficient to note that the components of a communication system typically include one or several power amplifiers.

The power amplifiers of the base station BTS or the mobile stations of FIG. 8 may be provided with linearisers as discussed above. However, it should be appreciated that the embodiments of the present invention are applicable to any other suitable type of equipment employing amplifiers.

It is also noted herein that while the above describes exemplifying embodiments of the invention, there are several variations and modifications which may be made to the disclosed solution without departing from the scope of the present invention as defined in the appended claims.

What is claimed is:

1. A lineariser for use with an amplifier comprising:
   an input to receive an input signal;
   an output for outputting adjusted signal to said amplifier;
   a signal path between the input and the output;
   a gain variations adjustment means on the signal path for adjusting amplitude dependent gain variations of the signal;
   a phase variations adjustment means on the signal path for adjusting amplitude dependent phase variations of the signal, said gain and phase variations adjustment means being individually adjustable elements; and
   a variable gain amplifier located on the signal path between the gain variations adjustment means and phase variations adjustment means,
   wherein said variable gain amplifier is for shifting the transfer characteristic curves of the amplitude dependent phase and gain variations relative to each other.

2. A lineariser as claimed in claim 1, the arrangement being such that the adjustment of the amplitude dependent gain variations does not produce any substantial amplitude dependent phase variations in the signal.

3. A lineariser as claimed in claim 1, the arrangement being such that the adjustment of the amplitude dependent phase variations does not produce any substantial amplitude dependent gain variations in the signal.

4. A lineariser as claimed in claim 1, wherein the turning point of the amplitude dependent phase variations curve is adapted to be shifted by the variable gain amplifier.

5. A lineariser for use with an amplifier comprising:
   an input to receive an input signal;
   an output for outputting adjusted signal to said amplifier;
   a signal path between the input and the output;
   a gain variations adjustment means on the signal path for adjusting amplitude dependent gain variations of the signal;
   a phase variations adjustment means on the signal path for adjusting amplitude dependent phase variations of the signal, said gain and phase variations adjustment means being individually adjustable elements; and
   a variable gain amplifier located on the signal path between the gain variations adjustment means and phase variations adjustment means,
   wherein a second variable gain amplifier is provided for adjusting the power level of the signal to be input in said amplifier.

6. A lineariser for use with an amplifier comprising:
   an input to receive an input signal;
   an output for outputting adjusted signal to said amplifier;
   a signal path between the input and the output;
   a gain variations adjustment means on the signal path for adjusting amplitude dependent gain variations of the signal;
   a phase variations adjustment means on the signal path for adjusting amplitude dependent phase variations of the signal, said gain and phase variations adjustment means being individually adjustable elements; and
   a variable gain amplifier located on the signal path between the gain variations adjustment means and phase variations adjustment means,
   wherein a third variable gain amplifier is provided for adjusting the power level of the input signal.

7. A lineariser as claimed in claim 1, wherein the gain variations adjustment means comprises a field effect transistor (FET).

8. A lineariser as claimed in claim 7, wherein the amplitude dependent gain characteristics of the signal are adjustable by adjusting the gate voltage of the field effect transistor.

9. A lineariser for use with an amplifier comprising:
   an input to receive an input signal;
   an output for outputting adjusted signal to said amplifier;
   a signal path between the input and the output;
   a gain variations adjustment means on the signal path for adjusting amplitude dependent gain variations of the signal;
   a phase variations adjustment means on the signal path for adjusting amplitude dependent phase variations of the signal, said gain and phase variations adjustment means being individually adjustable elements; and
   a variable gain amplifier located on the signal path between the gain variations adjustment means and phase variations adjustment means,
   wherein the gain variations adjustment means comprises a field effect transistor (FET), and
   wherein the amplitude dependent gain characteristics of the signal are adjustable by adjusting the drain voltage of the field effect transistor.

10. A lineariser as claimed in claim 7, wherein biasing means are provided to provide the field effect transistor with a biasing voltage.

11. A lineariser as claimed in of claim 10, wherein the field effect transistor is biased in a pinch-off region.

12. A lineariser as claimed in claim 10, wherein amplitude dependent gain variations of the signal are adapted to be adjusted by means of adjusting biasing voltage of the field effect transistor.

13. A lineariser for use with an amplifier comprising:
    an input to receive an input signal;
    an output for outputting adjusted signal to said amplifier;
    a signal path between the input and the output;
    a gain variations adjustment means on the signal path for adjusting amplitude dependent gain variations of the signal;
    a phase variations adjustment means on the signal path for adjusting amplitude dependent phase variations of the signal, said gain and phase variations adjustment means being individually adjustable elements; and
    a variable gain amplifier located on the signal path between the gain variations adjustment means and phase variations adjustment means,
    wherein the gain variations adjustment means comprises a field effect transistor (FET).
    wherein biasing means are provided to provide the field effect transistor with a biasing voltage, and
    wherein the biasing means comprise a first biasing means for biasing the gate voltage and a second biasing means for biasing the drain voltage of the field effect transistor.

14. A lineariser as claimed in claim 1, wherein the phase variations adjustment means is provided with a non-linear resistor element.

15. A lineariser as claimed in claim 14, wherein the phase variations adjustment means comprises a biasing voltage source for provision of a biasing voltage for the non-linear resistor element.

16. A lineariser as claimed in claim 14, wherein the non-linear resistor element comprises a forward biased diode.

17. A lineariser as claimed in claim 15, wherein the amplitude dependent phase variations of the signal are adapted to be adjusted by adjusting the biasing voltage of the non-linear resistor element.

18. A lineariser as claimed in claim 1, wherein the phase variations adjustment means is provided with capacitor means.

19. A lineariser as claimed in claim 1 being implemented as a microwave monolithic integrated circuit.

20. A lineariser as claimed in claim 1, wherein said input signal is a radio frequency signal.

21. A lineariser as claimed in claim 20, wherein said radio frequency signal is a signal to be transmitted between a base station and a mobile station of a cellular telecommunication system.

22. A lineariser as claimed in claim 1, wherein said at least variable gain amplifier is adapted to amplify signals.

23. A lineariser as claimed in claim 1, wherein said at least variable gain amplifier is adapted to attenuate signals.

24. A lineariser as claimed in claim 1 in combination with an amplifier.

25. Communications apparatus comprising a lineariser as claimed in claim 1.

26. A communications apparatus as claimed in claim 25, wherein said communications apparatus is used for communication in a cellular communications system.

27. A communications apparatus as claimed in claim 26, wherein said apparatus is a mobile station.

28. A communications apparatus as claimed in claim 26, wherein said apparatus is a base station.

29. An integrated circuit comprising a lineariser as claimed in claim 1.

30. An integrated circuit as claimed in claim 29, wherein said integrated circuit is a microwave monolithic integrated circuit.

31. A method of linearising an amplifier, comprising:
inputting a signal in a lineariser;
adjusting amplitude dependent gain variations of the signal independently from amplitude dependent phase variations of the signal;
adjusting amplitude dependent phase variations of the signal independently from the adjustment of the amplitude dependent gain variations of the signal, the amplitude dependent gain variations and the amplitude dependent phase variations being adjusted by separate adjustment means;
adjusting the power level of the signal by a variable gain amplifier located on the signal path between the gain variations adjustment means and phase variations adjustment means; and
outputting the signal from the lineariser to be input in said amplifier,
further comprising the step of adjusting the relative position between knee point of the amplitude dependent phase variations and the knee point of the amplitude dependent gain variations.

32. A method as claimed in claim 31, wherein the knee point of the amplitude dependent phase variations is adjusted.

33. A method as claimed in claim 31, wherein the relative positioning of the knee points is adjusted by said adjustment of the power level of the signal.

34. A method as claimed in claim 31, comprising adjustment of a gate voltage of a transistor provided for the adjustment of the amplitude dependent gain variations.

35. A method linearising an amplifier, comprising:
inputting a signal in a lineariser;
adjusting amplitude dependent gain variations of the signal independently from amplitude dependent phase variations of the signal;
adjusting amplitude dependent phase variations of the signal independently from the adjustment of the amplitude dependent gain variations of the signal, the amplitude dependent gain variations and the amplitude dependent phase variations being adjusted by separate adjustment means;
adjusting the power level of the signal by a variable gain amplifier located on the signal path between the gain variations adjustment means and phase variations adjustment means; and
outputting the signal from the lineariser to be input in said amplifier, and
further comprising adjustment of a drain voltage of a transistor provided for the adjustment of the amplitude dependent gain variations.

36. A method as claimed in claim 31, comprising adjustment of a biasing voltage supplied to a non-linear resistor element provided for the adjustment of the amplitude dependent phase variations.

* * * * *

UNITED STATES PATENT AND TRADEMARK OFFICE
CERTIFICATE OF CORRECTION

PATENT NO. : 6,985,032 B2
DATED : January 10, 2006
INVENTOR(S) : Elias Pekonen et al.

Page 1 of 1

It is certified that error appears in the above-identified patent and that said Letters Patent is hereby corrected as shown below:

<u>Title page,</u>
Insert Item -- [30] Foreign Application Priority Data
      November 6, 2000      (GB)      0027067.8 --.

Signed and Sealed this

Eleventh Day of April, 2006

JON W. DUDAS
*Director of the United States Patent and Trademark Office*